United States Patent
Lee et al.

(10) Patent No.: US 11,139,675 B2
(45) Date of Patent: Oct. 5, 2021

(54) HYBRID ENERGY STORAGE SYSTEM

(71) Applicant: LSIS CO., LTD., Anyang-si (KR)

(72) Inventors: Ji-Heon Lee, Anyang-si (KR); Ji-Hong Kim, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 15 days.

(21) Appl. No.: 16/613,949

(22) PCT Filed: Aug. 9, 2017

(86) PCT No.: PCT/KR2017/008589
§ 371 (c)(1),
(2) Date: Nov. 15, 2019

(87) PCT Pub. No.: WO2018/212404
PCT Pub. Date: Nov. 22, 2018

(65) Prior Publication Data
US 2021/0111581 A1 Apr. 15, 2021

(30) Foreign Application Priority Data

May 19, 2017 (KR) ........................ 10-2017-0062452

(51) Int. Cl.
*H02J 7/34* (2006.01)
*H02J 1/14* (2006.01)
(Continued)

(52) U.S. Cl.
CPC ............ *H02J 7/345* (2013.01); *G01R 31/382* (2019.01); *H01M 10/06* (2013.01); *H02J 1/12* (2013.01); *H02J 1/14* (2013.01)

(58) Field of Classification Search
CPC ..... H02J 7/345; H02J 1/12; H02J 1/14; G01R 31/382; H01M 10/06
See application file for complete search history.

(56) References Cited

U.S. PATENT DOCUMENTS

2011/0089896 A1   4/2011   Grivaux
2012/0267952 A1   10/2012  Ballatine et al.
(Continued)

FOREIGN PATENT DOCUMENTS

CN    105305430 A       2/2016
EP    3627648 A1 *      3/2020    .............. H02J 7/345
(Continued)

OTHER PUBLICATIONS

Extended European Search Report for related European Application No. 17910071.4; report dated Oct. 28, 2020—8 Pages.
(Continued)

*Primary Examiner* — Jared Fureman
*Assistant Examiner* — Aqeel H Bukhari
(74) *Attorney, Agent, or Firm* — K&L Gates LLP

(57) ABSTRACT

The present invention relates to a hybrid energy storage system. The hybrid energy storage system according to an embodiment of the present invention manages the power of a system and a direct current (DC) distribution network connected to the system, and comprises: a first DC-DC converter connected to the DC distribution network; a super capacitor connected to the first DC-DC converter and having the charge and discharge thereof controlled by the first DC-DC converter; a second DC-DC converter connected to the DC distribution network; and a battery connected to the second DC-DC converter and having the charge and discharge thereof controlled by the second DC-DC converter, wherein the first DC-DC converter comprises a DC distribution network stabilization controller, which filters the noise of a system voltage applied to the DC distribution network, and then generates a damping current so as to stabilize the DC distribution network.

11 Claims, 10 Drawing Sheets

(51) Int. Cl.
*H02J 1/12* (2006.01)
*G01R 31/382* (2019.01)
*H01M 10/06* (2006.01)

(56) References Cited

U.S. PATENT DOCUMENTS

2014/0375125 A1   12/2014   Ye et al.
2015/0194820 A1   7/2015    Liang et al.

FOREIGN PATENT DOCUMENTS

| | | | |
|---|---|---|---|
| JP | 2007097258 | A | 4/2007 |
| JP | 2007282313 | A | 10/2007 |
| JP | 2010130768 | A | 6/2010 |
| JP | 2011254696 | A | 12/2011 |
| JP | 2017034881 | A | 2/2017 |
| KR | 20110133118 | A | 12/2011 |
| KR | 1020130026259 | A | 3/2013 |
| KR | 1020130082240 | A | 7/2013 |
| KR | 20150090371 | A | 8/2015 |
| KR | 20150135843 | A | 12/2015 |
| KR | 101642235 | B1 | 7/2016 |
| KR | 20170129456 | A | 11/2017 |
| WO | 2014/167802 | A1 | 10/2014 |

OTHER PUBLICATIONS

Japanese Office Action for related Japanese Application No. 2020-514476'; action dated Dec. 22, 2020—3 Pages.
Korean Notice of Allowance and English translation for related Korean Application No. 10-2017-0062452; action dated Jan. 28, 2020; (5 pages).
International Search Report for related International Application No. PCT/KR2017/008589; report dated Nov. 22, 2019; (3 pages).
Written Opinion for related International Application No. PCT/KR2017/008589; report dated Nov. 22, 2019; (3 pages).
Japanese Notice of Allowance for related Japanese Application No. 2019-563426; action dated Jul. 9, 2021; (3 pages).

* cited by examiner

HYBRID ENERGY STORAGE SYSTEM

CROSS-REFERENCE TO RELATED APPLICATIONS

The present application is a National Stage of International Application No. PCT/KR2017/008589, filed on Aug. 9, 2017, which claims the benefit of earlier filing date and right of priority to Korean Application No. 10-2017-0062452, filed on May 19, 2017, the contents of which are all hereby incorporated by reference herein in their entirety.

FIELD OF THE INVENTION

The present disclosure relates to a hybrid energy storage system.

BACKGROUND OF THE INVENTION

A DC power distribution system that is emerging recently may directly supply DC (direct current) power to digital loads, thereby significantly reducing conversion loss. The DC distribution system may receive power directly from renewable energy sources and has a great economic effect.

An energy storage system is used to manage power of the DC power distribution system.

The energy storage system stores energy as produced into each linked system including power plants, substations and transmission lines, and then uses the power selectively and efficiently when necessary to increase energy efficiency.

The energy storage system may level an electric load with large fluctuations in time and season to improve an overall load rate to lower a cost of generating electricity. In addition, investment costs required for power facility expansion and operation costs thereof can be reduced, thereby reducing an electric bill and saving energy.

The energy storage system may be installed and used in a power generation plant, a transmission and distribution station, and houses in a power system for functions such as frequency regulation, stabilization of generator output using renewable energy, peak shaving, load leveling and emergency power.

In addition, the energy storage system may be divided into a physical energy storage system and a chemical energy storage system. The physical energy storage may use pumping, compressed air storage, flywheel, etc. The chemical energy storage may use a lithium ion battery, a lead acid battery, a Nas battery, and the like.

Specifically, FIG. 1 shows a conventional energy storage system.

FIG. 1 is a schematic diagram illustrating a conventional energy storage system.

Referring to FIG. 1, a conventional energy storage system 1 uses a battery 100. The battery 100 is connected to a DC distribution network 30, that is, a DC power system via a DC-DC converter 110. Power of the battery 100 is controlled by the DC-DC converter 110 connected thereto.

For reference, an AC-DC converter 20 is disposed between the power system 10 and the DC distribution network 30 and converts AC (Alternating Current) voltage of the power system 10 to DC (Direct Current) DC voltage and delivers the same to the DC distribution network 30. The DC distribution network 30 may include a load 36 and a distributed power system 33.

In another example, the AC-DC converter 20 may convert a DC voltage of DC distribution network 30 into an AC voltage and transmit it to power system 10. Further, the DC-DC converter 110 may convert the DC voltage of the battery 100 into a DC voltage and transmit the DC voltage to the DC distribution network 30 or convert the DC voltage of the DC distribution network 30 into a DC voltage and transfer the DC voltage to the battery 100.

In this connection, the load 36 may be plural and the distributed power system 33 may be plural.

The conventional energy storage system 1 includes a high-level management system 60 (for example, EMS (Energy Management System) that manages power in conjunction with the distributed power system 33. The high-level management system 60 uses a fuzzy logic or filtering scheme to stabilize an output (DG output) of the distributed power system 33.

Specifically, the high-level management system 60 uses a smoothing control scheme to stabilize the output (DG output) of the distributed power supply system 33 to generate an energy storage system command (Pess ref). The high-level management system 60 filters the output (DG output) of the distributed power system 33 in real time to measure change of the power flowing into the power system 10 from the distributed power system in terms of a DC component. Charge and discharge of the battery 100 is controlled by the high-level management system 60 based on the measured power change.

However, in the conventional energy storage system 1, an expensive lithium battery should be used as the battery 100. Power management of and power quality compensation for the DC distribution network 30 cannot be performed at the same time.

Accordingly, recent development of a hybrid energy storage system has been actively conducted in order to analyze a power quality problem that may occur in the operation of the DC (direct current) distribution system and to solve the problem.

In FIG. 2, an example of a conventional hybrid energy storage system is shown.

FIG. 2 is a schematic diagram illustrating an example of a conventional hybrid energy storage system.

Referring to FIG. 2, in one example of the conventional hybrid energy storage system 2, a battery 100 is directly connected to a DC distribution network 30. A super capacitor 70 is connected to the DC distribution network 30 via a DC-DC converter 80.

However, in the example of the hybrid energy storage system 2 of FIG. 2, power management of the battery 100 cannot be directly performed. The power of the battery 100 is automatically determined by a sum of the power of the distributed power supply system 33, the power supplied from the power system 10, and the charge/discharge power of the super capacitor 70.

That is, when the battery 100 is directly connected to the DC distribution network 30, and the super capacitor 70 is connected to the DC distribution network 30 via the DC-DC converter 80, a high-level management system 60 perform smoothing control of the output (DG output) of the distributed power system 33 to calculate the energy storage system command value. The high-level management system 60 filters the energy storage system command to create a power system power command (Pgrid ref.)

Further, the high-level management system 60 sends the generated power system power command (Pgrid ref) to the AC-DC converter 20 which performs voltage control of the DC distribution network 30. Based on a difference between the energy storage system command and the power system power command (Pgrid ref.), the high-level management system 60 creates a super capacitor power command (Psc ref.) for voltage control of the super capacitor and transmits the same to the DC-DC converter 80.

In this connection, the super capacitor power command (Psc ref.) refers to a command to control a very small power component as much as a difference between the energy storage system command and the power system power command (Pgrid ref.).

As a result, the example of the conventional hybrid energy storage system 2 has an advantage of using only one DC-DC converter 80. However, the voltage of the DC distribution network 30 must be controlled within a certain range to protect the battery 100. When a rated voltage of the DC distribution network 30 is high, the voltage of the battery 100 must be high. This cause a cost burden.

Subsequently, in FIG. 3 and FIG. 4, another example of a conventional hybrid energy storage system is shown.

FIG. 3 and FIG. 4 are schematic diagrams illustrating another example of a conventional hybrid energy storage system.

Referring to FIG. 3 and FIG. 4, another example of a conventional hybrid energy storage system 3 includes a structure in which a super capacitor 70 and a battery 100 are connected to a DC distribution network 30 via DC-DC converters 80 and 110, respectively.

For reference, in this structure, the powers of the super capacitor 70 and the battery 100 may be controlled by the first DC-DC converter 80 and the second DC-DC converter 110 independently of each other. Each of the power commands (Psc ref, Pbatt ref) may be controlled by the high-level management system 60. Further, the SOC (State of Charge) of the battery 100 and the SOC of the super capacitor 70 may be managed separately. The battery 100 and super capacitor 70 may have different voltage levels. This means that the battery 100 and super capacitor 70 may have desired capacities and voltages.

Further, the high-level management system 60 preforms smoothing control of the output (DG output) of the distributed power system 33 to calculates an energy storage system command value. The high-level management system 60 filters the energy storage system command to create a battery power command (Pbatt ref.)

Further, the high-level management system 60 generates a super capacitor power command (Psc ref) for voltage control of the super capacitor based on a difference between the energy storage system command and the battery power command (Pbatt ref).

In this connection, the super capacitor power command (Psc ref.) refers to a command to control a very small power component as much as a difference between the energy storage system command and the battery power command (Pbatt ref).

Therefore, in the power change of the DC distribution network 30, a rapid and small power change is dealt with the super capacitor 70, while a massive power changes over a long period of time is managed by the battery 100.

As a result, another example of the conventional hybrid energy storage system 3 may perform only power management of the DC distribution network 30, but may not perform power quality compensation of the DC distribution network 30.

For reference, as described above, the DC distribution network 30 may include a plurality of distributed power systems and loads. Thus, a switching harmonics component generated from the converters (that is, the power converters) in the DC distribution network 30 may cause nonlinear characteristics of the voltage of the DC distribution network 30, that is, the DC power system voltage.

Specifically, referring to FIG. 5, it may be seen that a voltage Vc of the DC distribution network may exhibit approximately 200% variation due to an equivalent circuit and incoming harmonic component.

The large voltage fluctuation may reduce control performance of devices connected to the DC distribution network 30 and shorten lifespans of the devices connected to the DC distribution network 30.

In another example, in a conventional hybrid energy storage system, as a length of a line of the DC distribution network becomes larger and a capacity increases, a resistor may be added to the line or the output capacitor value of the converter may be increased to increase damping of the power system. This scheme is practically impossible due to a problem of heat generation of the resistor and a cost of the capacitor.

BRIEF SUMMARY OF THE INVENTION

The present disclosure aims to provide a hybrid energy storage system that may stabilize a power quality while managing the power of the DC distribution network.

One aspect of the present disclosure provides a hybrid energy storage system for managing a power of a power system and a power of a direct current (DC) distribution network connected to the power system, wherein the energy storage system includes: a first DC-DC converter connected to the DC distribution network; a super capacitor connected to the first DC-DC converter, wherein charge and discharge of the super capacitor are controlled by the first DC-DC converter; a second DC-DC converter connected to the DC distribution network; and a battery connected to the second DC-DC converter, wherein charge and discharge of the battery are controlled by the second DC-DC converter, wherein the first DC-DC converter includes a DC distribution network stabilization controller configured to filter a noise of a power system voltage applied to the DC distribution network and then generate a damping current to stabilize the DC distribution network.

In one implementation, the DC distribution network stabilization controller includes: a filter for filtering the noise of the power system voltage applied to the DC distribution network; and an equivalent damping resistance generator to generate an equivalent damping resistance based on a voltage difference between the power system voltage and the noise-filtered power system voltage, and based on the generated damping current.

In one implementation, the hybrid energy storage system further includes a high-level management system configured to control the first DC-DC converter and the second DC-DC converter, wherein the high-level management system is configured to: provide the first DC-DC converter with a power command related to charging and discharging of the super capacitor; and provide the second DC-DC converter with a power command related to charging and discharging of the battery.

In one implementation, the DC distribution network includes a load and a distributed power system, wherein an AC-DC converter configured to convert an AC voltage of the power system into a DC voltage and deliver the DC voltage to the DC distribution network is disposed between and coupled to the power system and the DC distribution network.

In one implementation, the high-level management system is configured to: perform smoothing control of an output of the distributed power system to calculate an energy storage system command value; filter the calculated energy storage system command value to calculate a power command value related to charge/discharge of the battery; and calculate a power command value related to charge/discharge of the super capacitor based on a difference between the energy storage system command value and the power command value related to the charge/discharge of the battery.

In one implementation, the first DC-DC converter includes: a DC distribution network voltage controller for controlling a voltage of the DC distribution network when the power system is disconnected to the DC distribution network; a super capacitor voltage controller for controlling a voltage of the super capacitor; and a first current controller for generating a first gate pulse based on a current command provided from the DC distribution network stabilization controller.

In one implementation, the first DC-DC converter is configured to: determine whether the power system is connected to the DC distribution network; when whether the power system is connected to the DC distribution network is determined, determine whether a voltage of the super capacitor is maintained within a predefined voltage range; when the voltage of the super capacitor reaches a upper or lower limit of the predefined voltage range, allow the super capacitor voltage controller to control the voltage of the super capacitor to generate a current command; combine the generated current command with a current command generated by the DC distribution network stabilization controller to generate a final current command; and allow the first current controller to generate the first gate pulse based on the final current command.

In one implementation, the first DC-DC converter is configured to: when the power system and the DC distribution network are connected to each other, receive the power command associated with charging and discharging of the super capacitor from the high-level management system; or when the power system and the DC distribution network are disconnected from each other, allow the DC distribution network voltage controller to initiate a DC distribution network voltage control mode.

In one implementation, the first DC-DC converter further includes: a first gate driver for receiving the first gate pulse from the first current controller; and a first semiconductor element controlled by the first gate driver.

In one implementation, the second DC-DC converter includes: a battery voltage controller configured to receive the power command related to charge/discharge of the battery from the high-level management system and to control a voltage of the battery; a second current controller configured for generating a second gate pulse based on a current command provided from the battery voltage controller; a second gate driver to receive the second gate pulse from the second current controller; and a second semiconductor element controlled by the second gate driver.

In one implementation, the second DC-DC converter is configured to: determine whether a SOC (State of Charge) of the battery is within a predefined stability range; and when the SOC of the battery is out of the predefined stability range, allow the battery voltage controller to send a correction value to compensate for the SOC of the battery to the high-level management system In one implementation, the battery includes a lead-acid battery.

As mentioned above, in accordance with the present disclosure, an inexpensive lead-acid battery and super capacitor may replace an expensive lithium battery, and, at the same time, the power quality problem of the DC distribution network may be solved. This may not only improve the voltage stability but also manage the energy efficiently.

In addition to the effects as described above, specific effects of the present disclosure will be described together with detailed descriptions for carrying out the present disclosure.

DETAILED DESCRIPTION OF THE INVENTION

Figure 1:
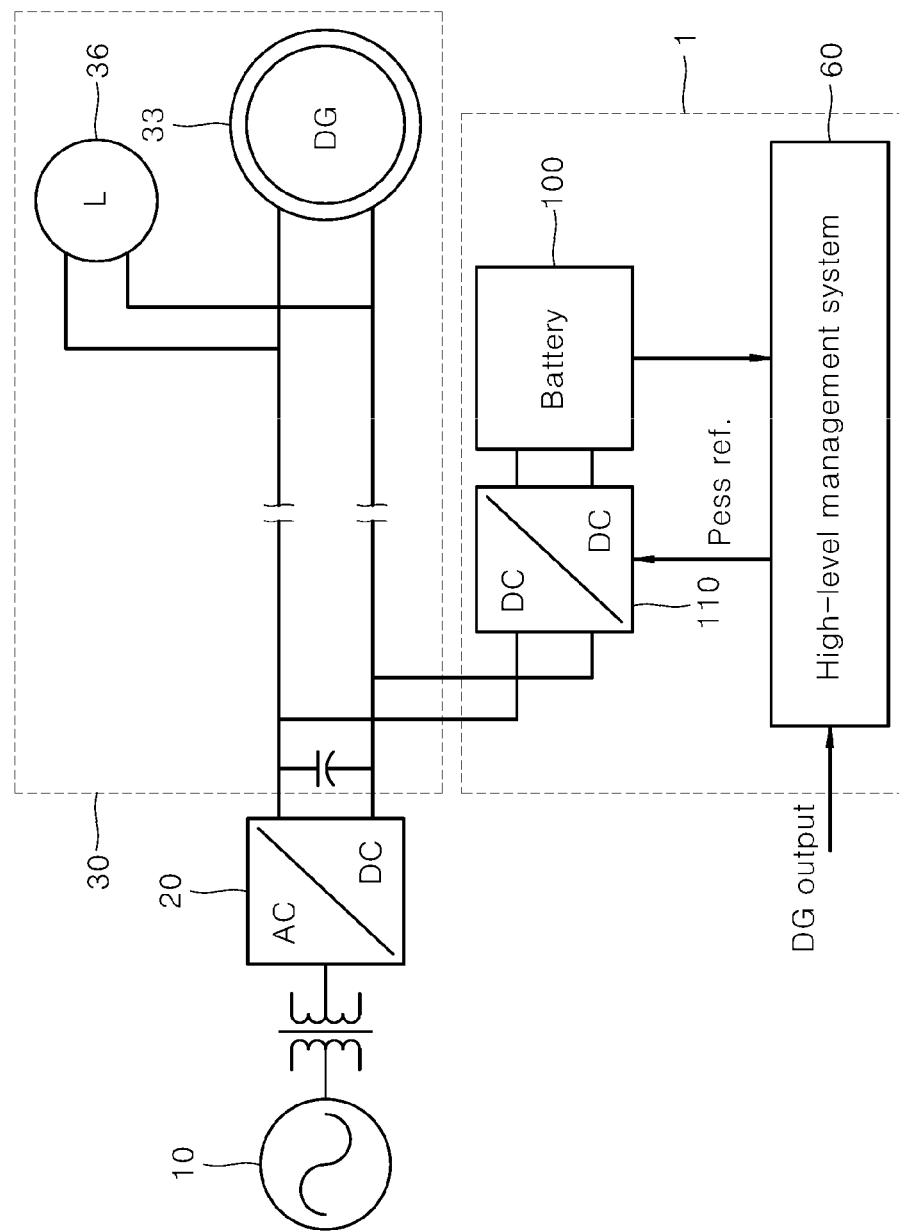
FIG. 1 is a schematic diagram illustrating a conventional energy storage system.
Figure 2:
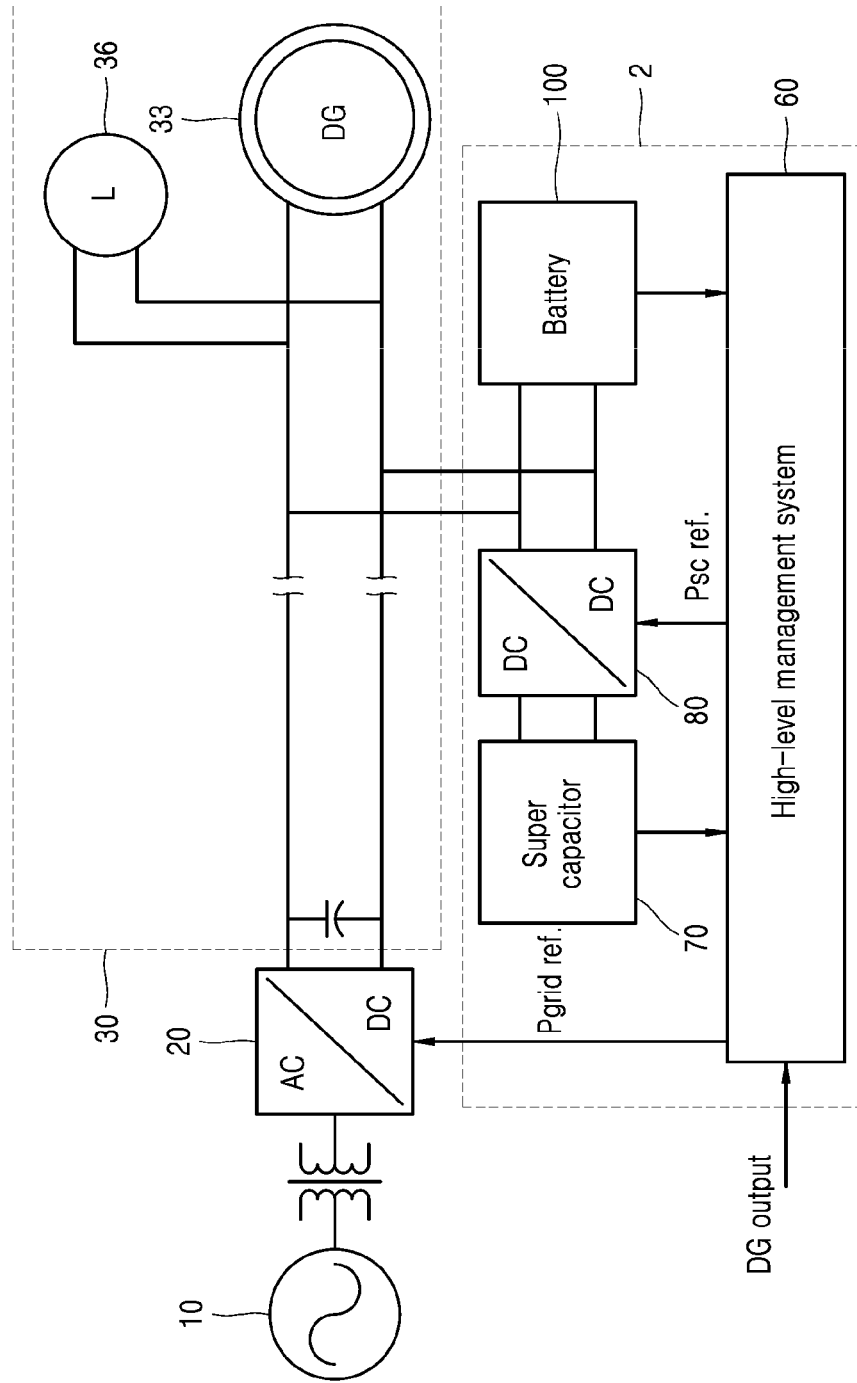
FIG. 2 is a schematic diagram illustrating an example of a conventional hybrid energy storage system.

The above objects, features and advantages are described in detail below with reference to the accompanying drawings. Accordingly, a person having ordinary knowledge in the technical field to which the present disclosure belongs may easily implement a technical idea of the present disclosure. In describing the present disclosure, detailed descriptions of known components or methods related to the present disclosure will be omitted when it is determined that they may unnecessarily obscure a gist of the present disclosure. Hereinafter, exemplary embodiments of the present disclosure will be described in detail with reference to the accompanying drawings. In the drawings, the same reference numerals are used to indicate the same or similar components.

Hereinafter, a hybrid energy storage system according to an embodiment of the present disclosure will be described with reference to FIG. 6 to FIG. 10.

Figure 6:
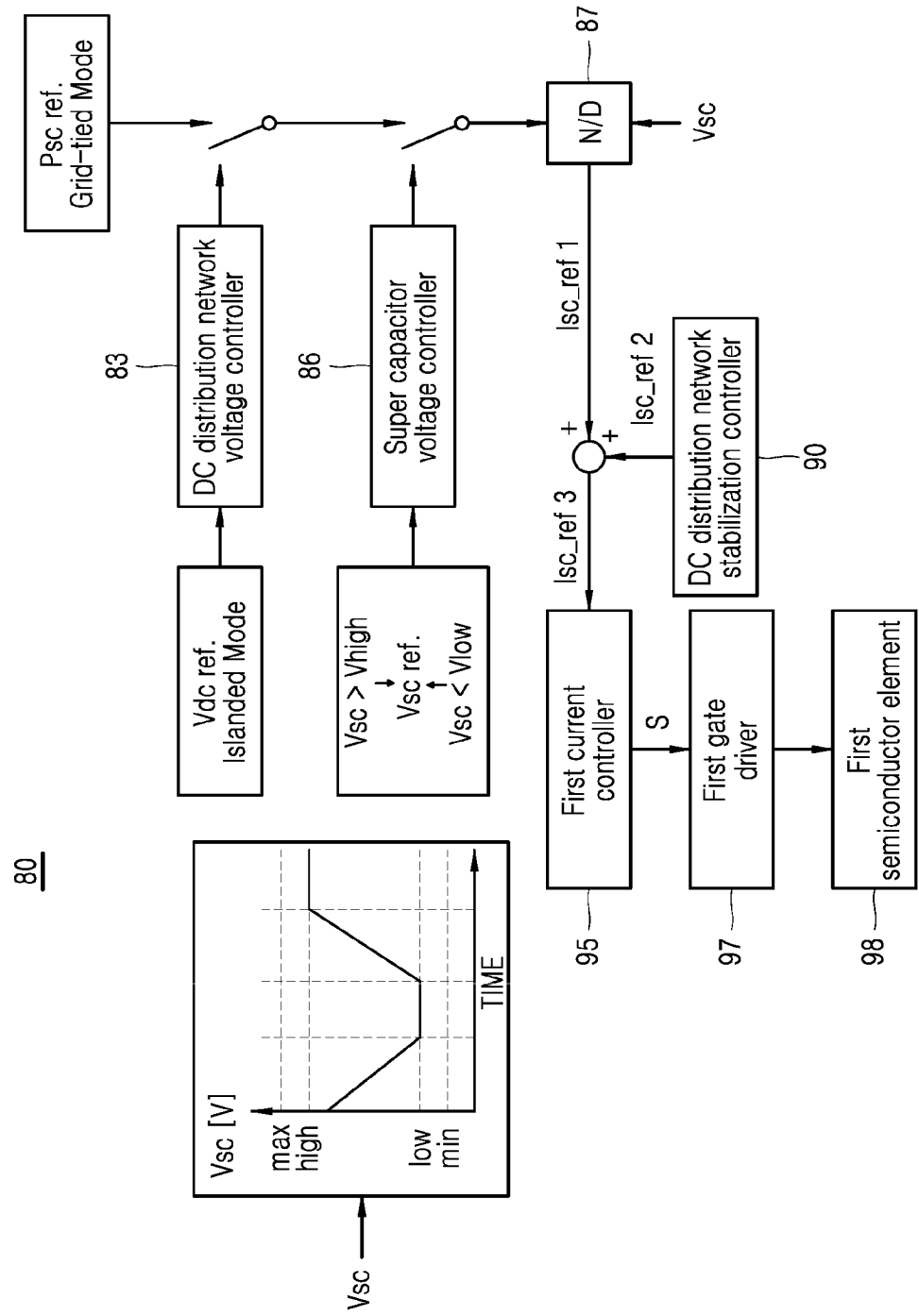
FIG. 6 is a diagram illustrating a control flow of a first DC-DC converter of a hybrid energy storage system according to an embodiment of the present disclosure.
Figure 7:
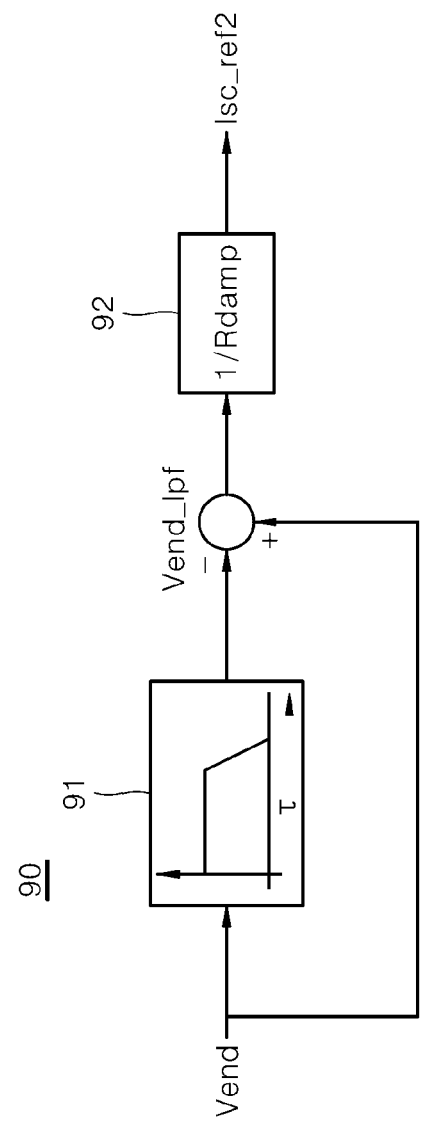
FIG. 7 illustrates a control flow of a DC distribution network stabilization controller in FIG. 6.
Figure 8:
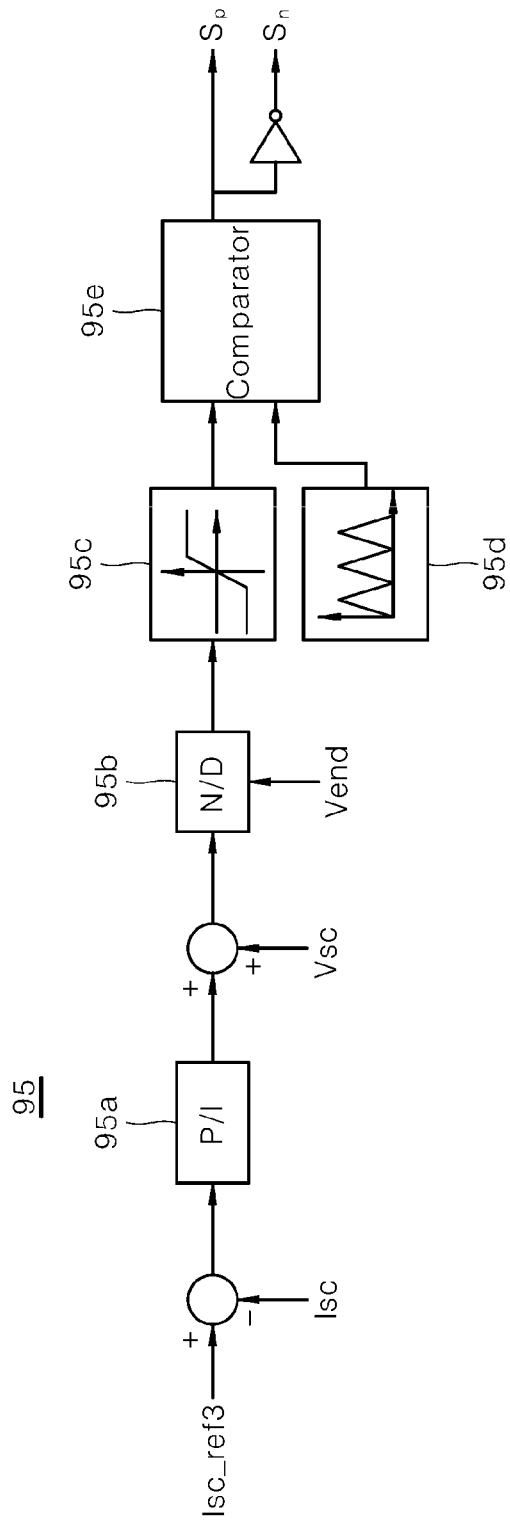
FIG. 8 illustrates a control flow of a first current controller in FIG. 6.
Figure 9:
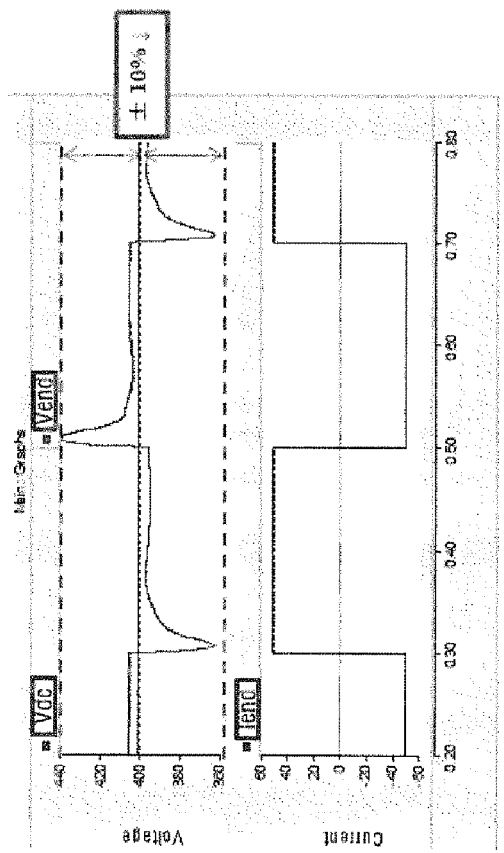
FIG. 9 is a graph illustrating voltage and current variation of a DC distribution network controlled by a hybrid energy storage system according to the present disclosure.
Figure 10:
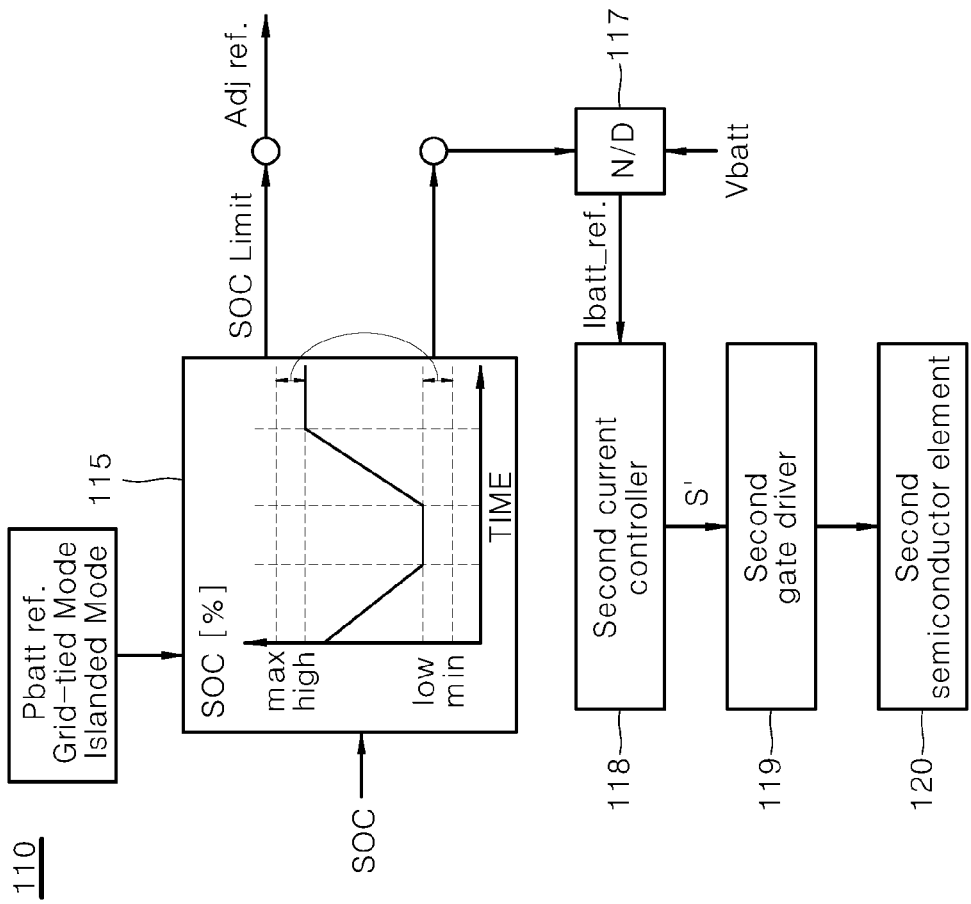
FIG. 10 is a diagram illustrating a control flow of a second DC-DC converter of a hybrid energy storage system according to an embodiment of the present disclosure.

FIG. 6 is a diagram illustrating a control flow of a first DC-DC converter of a hybrid energy storage system according to an embodiment of the present disclosure. FIG. 7 illustrates a control flow of a DC distribution network stabilization controller in FIG. 6. FIG. 8 illustrates a control flow of a first current controller in FIG. 6. FIG. 9 is a graph illustrating voltage and current variation of a DC distribution network controlled by a hybrid energy storage system according to the present disclosure. FIG. 10 is a diagram illustrating a control flow of a second DC-DC converter of a hybrid energy storage system according to an embodiment of the present disclosure.

Figure 3:
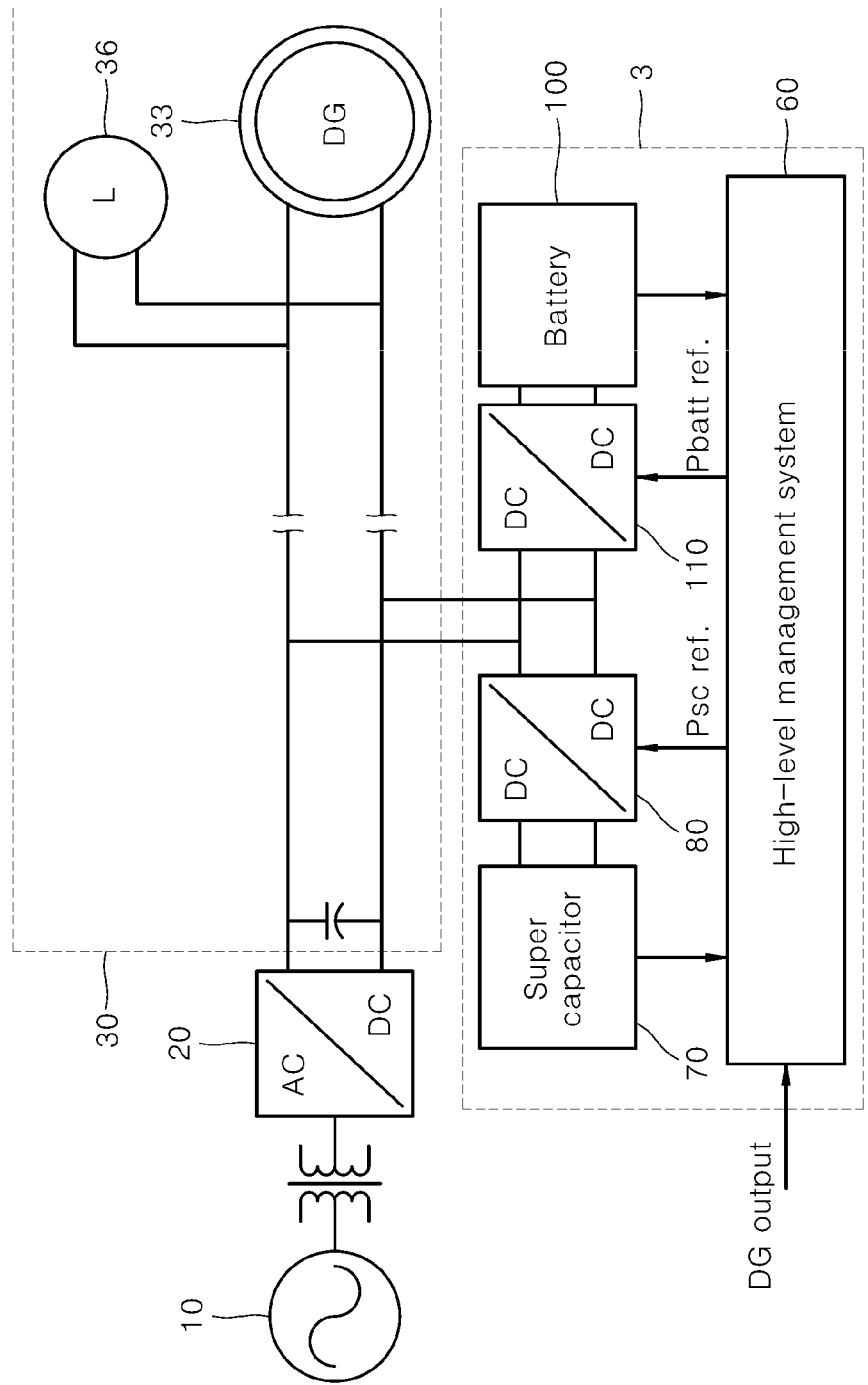
FIG. 3 and FIG. 4 are schematic diagrams illustrating another example of a conventional hybrid energy storage system.

For reference, the hybrid energy storage system according to the present disclosure has the same structure as the other example 3 of the conventional hybrid energy storage system shown in FIG. 3.

That is, as shown in FIG. 3, the hybrid energy storage system according to the embodiment of the present disclosure may include a first DC-DC converter 80 connected to a DC distribution network 30, a super capacitor 70 connected to the first DC-DC converter 80 such that charge and discharge thereof is controlled by the first DC-DC converter 80, a second DC-DC converter 110 connected to the DC distribution network 30, a battery 100 connected to the second DC-DC converter 110 such that charge and discharge thereof is controlled by the second DC-DC converter 110, and a high-level management system 60 for controlling the first DC-DC converter 80, and the second DC-DC converter 110.

In this connection, the battery 100 may include, for example, a lead-acid battery.

Figure 4:
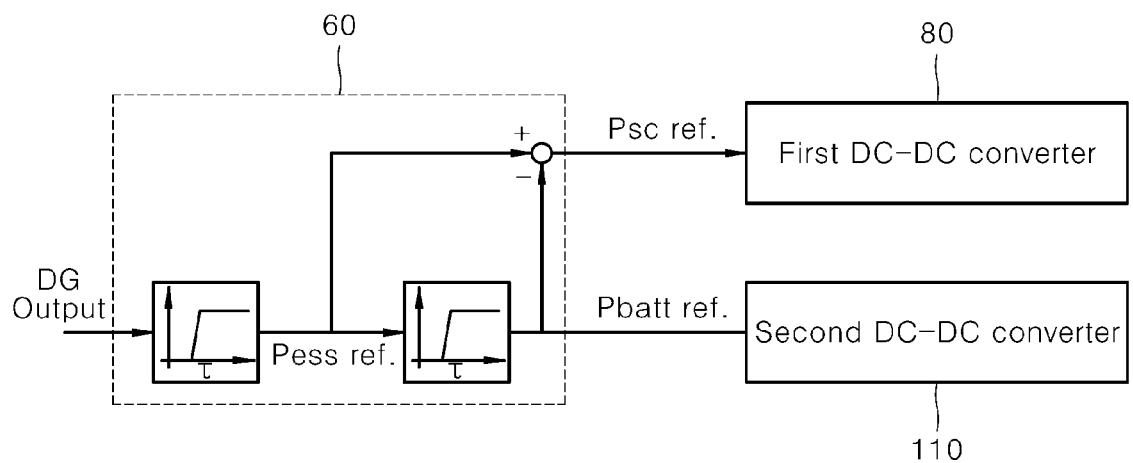
Figure 5:
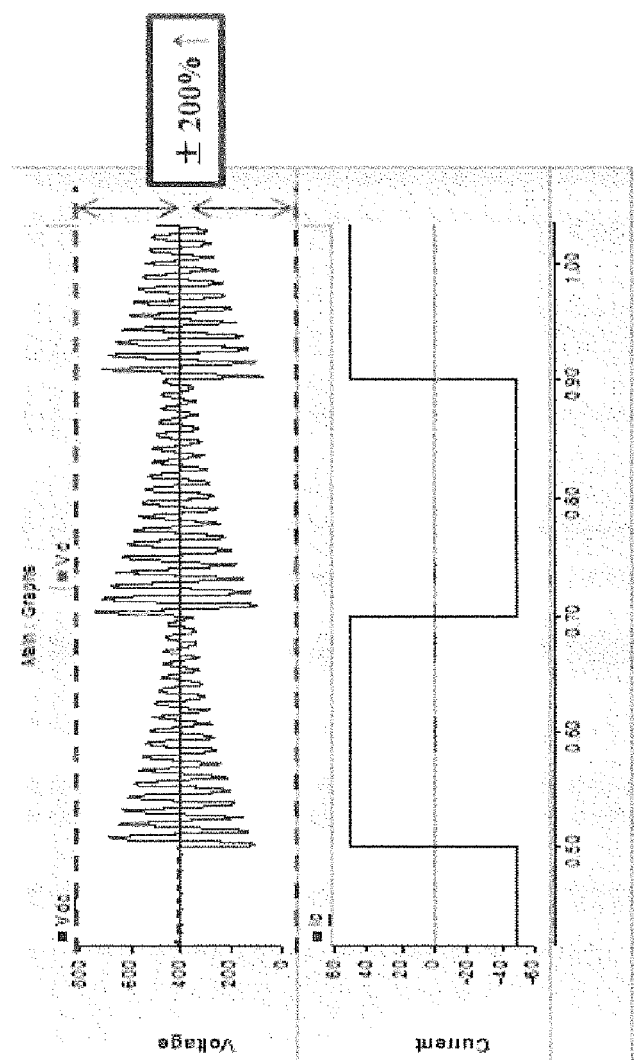
FIG. 5 is a graph illustrating variation of voltage and current in a conventional DC distribution network.

Further, as shown in FIG. 4, in a normal mode, the high-level management system 60 may perform smoothing control of the output of the distributed power system 33 to calculate a value of an energy storage system command (Pess ref), that is, an energy storage system command value. Then, the high-level management system 60 may filter the calculated energy storage system command value to calculate a value of a battery power command (Pbatt ref.), that is, a power command value related to charge/discharge of battery 100. Based on a difference between the energy storage system command value and the power command value related to the charge/discharge of the battery 100, the high-level management system 60 may calculate a value of a super capacitor command (Psc ref), that is, a power command value related to charge/discharge of the super capacitor 70.

Further, the high-level management system 60 may provide the first DC-DC converter 80 with a power command related to charging and discharging the super capacitor 70, i.e. the super capacitor power command (Psc ref). The high-level management system 60 may provide the second DC-DC converter 110 with a power command related to charging and discharging of the battery 100, that is, the battery power command (Pbatt ref).

For reference, the high-level management system 60 may manage the power in conjunction with the distributed power system 33. For example, the system 60 may include an EMS (Energy Management System).

However, unlike FIG. 3, the hybrid energy storage system according to the present disclosure may apply a noise filtering technique and an equivalent positive resistance component to the first DC-DC converter 80 and apply a stabilization technique to increase the damping of the power system 10. Those differences between the configurations of FIG. 3 and FIG. 6 will be described.

Referring to FIG. 3 and FIG. 6 to FIG. 8, the first DC-DC converter 80 of the hybrid energy storage system according to the embodiment of the present disclosure may include a DC distribution network voltage controller 83, a super capacitor voltage controller 86, a DC distribution network stabilization controller 90, a first current controller 95, a first gate driver 97, and a first semiconductor element 98.

Specifically, the DC distribution network voltage controller 83 may control the voltage of the DC distribution network 30 in disconnection of the power system 10, for example, accident or power failure of the power system 10. The super capacitor voltage controller 86 may control the voltage of the super capacitor 70.

Further, the DC distribution network stabilization controller 90 may filter a noise of the power system voltage applied to the DC distribution network 30 and then generate a damping current to stabilize the DC distribution network 30. The first current controller 95 may generate a first gate pulse S based on a current command provided from the DC distribution network stabilization controller 90.

Further, the first gate driver 97 may receive the first gate pulse S from the first current controller 95 to control the first semiconductor element 98. That is, the first semiconductor element 98 may be controlled by the first gate driver 97.

For reference, the first semiconductor element 98 may include, for example, an IGBT (insulated gate bipolar mode transistor), but is not limited thereto.

The first DC-DC converter 80 including such a configuration may have a following control flow.

In detail, the first DC-DC converter 80 may first determine whether the power system 10 is connected to the DC distribution network 30.

That is, when the power system 10 is connected to the DC distribution network 30 (that is, power system connected mode or grid-tied mode), the first DC-DC converter 80 may basically receive the power command (Psc ref) related to the charge and discharge of the super capacitor 70 from the high-level management system 60. When the power system 10 is disconnected to the DC distribution network 30 (that is, power system disconnected mode or grid-islanded mode), the first DC-DC converter 80 may start a DC distribution network voltage control mode using the DC distribution network voltage controller 83.

That is, the DC distribution network voltage controller 83 may initiate the DC distribution network voltage control mode based on a DC distribution network voltage command (Vdc ref).

When it is determined whether the power system 10 and the DC distribution network 30 are connected to each other, the first DC-DC converter 80 may determine whether the voltage of the super capacitor 70 is maintained within a predefined voltage range.

Specifically, when the voltage of the super capacitor 70 reaches an upper limit Vhigh or a lower limit Vlow of the predefined voltage range, the first DC-DC converter 80 performs voltage control of the super capacitor 70 using the super capacitor voltage controller 86 to generate a current command (Isc_ref1), that is, a first super capacitor current command.

That is, the super capacitor voltage controller 86 may perform voltage control of the super capacitor 70 based on the super capacitor voltage command (Vsc ref).

After the voltage control of the super capacitor 70 has been performed by the super capacitor voltage controller 86, the first super capacitor current command (Isc_ref1) generated through an element 87 to which a current voltage Vsc of the super capacitor 70 is input is combined with a current command (Isc_ref2) generated from the DC distribution network stabilization controller 90, that is, a second super capacitor current command, thereby to obtain a final current command (Isc_ref3), that is, a third super capacitor current command.

In this connection, the element 87 may be, for example, an element having a division operation, that is, a division function.

The generated third super capacitor current command (Isc_ref3) may be provided to the first current controller 95. The first current controller 95 may generate the first gate pulse S based on the third super capacitor current command Isc_ref3 and provide the first gate pulse to the first gate driver 97.

The first gate driver 97 may control the first semiconductor element 98 based on the first gate pulse S as provided.

In this connection, referring to FIG. 7, it may be seen that the DC distribution network stabilization controller 90 includes a filter 91 for filtering a noise of the power system voltage vend applied to the DC distribution network 30, and an equivalent damping resistance generator 92 for generating a equivalent damping resistance Rdamp based on a voltage difference Vend_lpf between a power system voltage Vend and a noise-filtered power system voltage and based on a damping current.

That is, the DC distribution network stabilization controller 90 may use a filter 91 (for example, a low pass filter) to filter the noise of the power system voltage Vend applied to the DC distribution network 30, that is, a voltage of an end of the DC distribution network 30.

Further, the DC distribution network stabilization controller 90 may calculate the voltage difference Vend_lpf between the power system voltage Vend and the noise filtered power system voltage, and may use the equivalent damping resistance generator 92 to create the equivalent damping resistance Rdamp based on the generated damping current and the voltage difference Vend_lpf. Thus, the second super capacitor current command (Isc_ref2) may be created.

Subsequently, referring to FIG. 8, the first current controller 95 may include a PI controller 95a, an element 95b, a limiter 95c, a switching carrier 95d, and a comparator 95e.

That is, a difference between the third super capacitor current command (Isc_ref3) and the super capacitor current (Isc) may be provided to the PI controller 95a as an input thereto. A sum of an output of the PI controller 95a and a super capacitor voltage (Vsc) and a terminal voltage Vend of the DC distribution network 30 may be provided to the element 95b. An output of the element 95b may be provided to the limiter 95c. Then, an output of the limiter 95c and an output of the switching carrier 95d may be provided to the comparator 95e as an input thereto. Thus, the comparator 95e may generate a gate pulse (S; Sp, Sn (inverted signal of Sp)).

As a result, the first DC-DC converter 80 may uas the above-described structure and control method to reduce the variation of the terminal voltage Vend of the DC distribution network 30 to a value within 10% as shown in FIG. 9.

That is, the first DC-DC converter 80 maintains the voltage variation of the DC distribution network 30 to be smaller than 10%. Thus, even when multiple devices are connected to the DC distribution network 30 and the line is lengthened, the voltage fluctuation may be reduced.

Referring to FIGS. 3 and 10, the second DC-DC converter 110 of the hybrid energy storage system according to the present disclosure may include a battery voltage controller 115, a second current controller 118, a second gate driver 119, and a second semiconductor element 120.

Specifically, the battery voltage controller 115 may receive a power command (Pbatt ref) related to charge/discharge of the battery 100 from the high-level management system 60 and control the voltage of the battery 100. The second current controller 118 may generate a second gate pulse S' based on a current command (Pbatt ref.) provided from the battery voltage controller 115.

Further, the second gate driver 119 may receive the second gate pulse S' from the second current controller 118 to control the second semiconductor element 120. That is, the second semiconductor element 120 may be controlled by the second gate driver 119.

For reference, the second semiconductor element 120 may include, for example, an IGBT (insulated gate bipolar mode transistor), but is not limited thereto.

The second DC-DC converter 110 including the above configuration may have a following control flow.

In detail, the second DC-DC converter 110 may first determine whether the SOC (State of Charge) of the battery 100 is maintained within a predefined stability range.

That is, the second DC-DC converter 110 basically receives the battery power command (Pbatt ref) from the high-level management system 60 in both the power system connected mode (grid-tied mode) and the power system disconnected mode (grid-islanded mode). When the SOC of the battery 100 is within the predefined stability range, the second DC-DC converter 110 may control the charge and discharge of the battery 100 based on the battery power command (Pbatt ref) provided from the high-level management system 60.

However, when the SOC of the battery 100 is out of the predefined stability range (SOC Limit), the battery voltage controller 115 may supply a correction requirement (Adj ref) for compensating for the SOC of the battery 100 to the high-level management system 60.

Further, when the battery power command (Pbatt ref) provided from the battery voltage controller 115 and a current voltage Vbatt of the battery 100 are input to the element 117, the battery current command (Ibatt_ref) may be generated.

In this connection, the element 117 may be, for example, an element having a division operation, that is, a division function.

The created battery current command (Ibatt_ref) may be provided to the second current controller 118. The second current controller 118 may generate the second gate pulse S' based on the battery current command (Ibatt_ref.) and provide the pulse to the second gate driver 119.

The second gate driver 119 may control the second semiconductor element 120 based on the provided second gate pulse S'.

As described above, in the hybrid energy storage system according to the embodiment of the present disclosure, the expensive lithium-based battery may be replaced with a cheap lead-acid battery (that is, the battery 100 and super capacitor 70). At the same time, the power quality problem of the DC distribution network 30 may be solved. This may not only to improve voltage stability but also efficiently manage the energy.

The present disclosure as described above may be subjected to various substitutions, modifications, and changes by a person having ordinary knowledge in the technical field to which the present disclosure belongs without departing from the technical spirit of the present disclosure. Thus, the present disclosure is not limited by the accompanying drawings.

What is claimed is:

1. A hybrid energy storage system for managing a power of a power system and a power of a direct current (DC) distribution network connected to the power system, wherein the energy storage system includes:
   a first DC-DC converter connected to the DC distribution network;
   a super capacitor connected to the first DC-DC converter, wherein charge and discharge of the super capacitor are controlled by the first DC-DC converter;
   a second DC-DC converter connected to the DC distribution network; and
   a battery connected to the second DC-DC converter, wherein charge and discharge of the battery are controlled by the second DC-DC converter, wherein the first DC-DC converter includes a DC distribution network stabilization controller configured to filter a noise of a power system voltage applied to the DC distribution network and then generate a damping current to stabilize the DC distribution network, wherein the DC distribution network stabilization controller includes:
- a filter for filtering the noise of the power system voltage applied to the DC distribution network; and
- an equivalent damping resistance generator to generate an equivalent damping resistance based on a voltage difference between the power system voltage and the noise-filtered power system voltage, and based on the generated damping current.

2. The hybrid energy storage system of claim 1, wherein the hybrid energy storage system further includes a high-level management system configured to control the first DC-DC converter and the second DC-DC converter, wherein the high-level management system is configured to:
- provide the first DC-DC converter with a power command related to charging and discharging of the super capacitor; and
- provide the second DC-DC converter with a power command related to charging and discharging of the battery.

3. The hybrid energy storage system of claim 2, wherein the DC distribution network includes a load and a distributed power system, wherein an AC-DC converter configured to convert an AC voltage of the power system into a DC voltage and deliver the DC voltage to the DC distribution network is disposed between and coupled to the power system and the DC distribution network.

4. The hybrid energy storage system of claim 3, wherein the high-level management system is configured to:
- perform smoothing control of an output of the distributed power system to calculate an energy storage system command value;
- filter the calculated energy storage system command value to calculate a power command value related to charge/discharge of the battery; and
- calculate a power command value related to charge/discharge of the super capacitor based on a difference between the energy storage system command value and the power command value related to the charge/discharge of the battery.

5. The hybrid energy storage system of claim 2, wherein the first DC-DC converter includes:
- a DC distribution network voltage controller for controlling a voltage of the DC distribution network when the power system is disconnected from the DC distribution network;
- a super capacitor voltage controller for controlling a voltage of the super capacitor; and
- a first current controller for generating a first gate pulse based on a current command provided from the DC distribution network stabilization controller.

6. The hybrid energy storage system of claim 5, wherein the first DC-DC converter is configured to:
- determine whether the power system is connected to the DC distribution network;
- when it is determined whether the power system is connected to the DC distribution network, determine whether a voltage of the super capacitor is maintained within a predefined voltage range;
- when the voltage of the super capacitor reaches an upper limit or a lower limit of the predefined voltage range, allow the super capacitor voltage controller to control the voltage of the super capacitor to generate a current command;
- combine the generated current command with a current command generated by the DC distribution network stabilization controller to generate a final current command; and
- allow the first current controller to generate the first gate pulse based on the final current command.

7. The hybrid energy storage system of claim 6, wherein the first DC-DC converter is configured to:
- when the power system and the DC distribution network are connected to each other, receive the power command associated with charging and discharging of the super capacitor from the high-level management system; and/or
- when the power system and the DC distribution network are disconnected from each other, allow the DC distribution network voltage controller to initiate a DC distribution network voltage control mode.

8. The hybrid energy storage system of claim 5, wherein the first DC-DC converter further includes:
- a first gate driver for receiving the first gate pulse from the first current controller; and
- a first semiconductor element controlled by the first gate driver.

9. The hybrid energy storage system of claim 2, wherein the second DC-DC converter includes:
- a battery voltage controller configured to receive the power command related to charge/discharge of the battery from the high-level management system and to control a voltage of the battery;
- a second current controller configured for generating a second gate pulse based on a current command provided from the battery voltage controller;
- a second gate driver to receive the second gate pulse from the second current controller; and
- a second semiconductor element controlled by the second gate driver.

10. The hybrid energy storage system of claim 9, wherein the second DC-DC converter is configured to:
- determine whether a SOC (State of Charge) of the battery is within a predefined stability range; and
- when the SOC of the battery is out of the predefined stability range, allow the battery voltage controller to send a correction value to compensate for the SOC of the battery to the high-level management system.

11. The hybrid energy storage system of claim 1, wherein the battery includes a lead-acid battery.

* * * * *